United States Patent
Lehnhardt et al.

(10) Patent No.: US 10,497,830 B2
(45) Date of Patent: Dec. 3, 2019

(54) OPTOELECTRONICS SEMICONDUCTOR DEVICE AND METHOD FOR PRODUCING AN OPTOELECTRONIC SEMICONDUCTOR DEVICE

(71) Applicant: OSRAM Opto Semiconductors GmbH, Regensburg (DE)

(72) Inventors: Thomas Lehnhardt, Regensburg (DE); Martin Mandl, Lappersdorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/550,008

(22) PCT Filed: Jan. 11, 2016

(86) PCT No.: PCT/EP2016/050388
§ 371 (c)(1),
(2) Date: Aug. 9, 2017

(87) PCT Pub. No.: WO2016/128158
PCT Pub. Date: Aug. 18, 2016

(65) Prior Publication Data
US 2018/0019373 A1    Jan. 18, 2018

(30) Foreign Application Priority Data
Feb. 10, 2015   (DE) .................. 10 2015 101 888

(51) Int. Cl.
*H01L 33/08*    (2010.01)
*H01L 27/15*    (2006.01)
*H01L 33/14*    (2010.01)
*H01L 33/24*    (2010.01)
*H01L 33/38*    (2010.01)
*H01L 33/50*    (2010.01)

(52) U.S. Cl.
CPC ............ *H01L 33/08* (2013.01); *H01L 27/153* (2013.01); *H01L 33/14* (2013.01); *H01L 33/24* (2013.01); *H01L 33/38* (2013.01); *H01L 33/50* (2013.01)

(58) Field of Classification Search
CPC ......... H01L 33/08; H01L 33/50; H01L 33/38; H01L 33/14; H01L 27/153; H01L 33/24
See application file for complete search history.

(56) References Cited

U.S. PATENT DOCUMENTS

| 5,231,049 | A | 7/1993 | Neugebauer et al. |
| 7,321,159 | B2 | 1/2008 | Schatz |
| 2008/0297453 | A1 | 12/2008 | Ray et al. |

(Continued)

FOREIGN PATENT DOCUMENTS

WO       2015177131 A1    11/2015

*Primary Examiner* — Julia Slutsker
(74) *Attorney, Agent, or Firm* — McDermott Will & Emery LLP

(57) ABSTRACT

An optoelectronic semiconductor component is specified, comprising a multiplicity of radiation generating elements (14) arranged at a distance from one another on a surface (22) of a carrier element (20), wherein each of the radiation generating elements has a diameter of less than 10 μm in a direction perpendicular to the surface of the carrier element and adheres to the surface of the carrier element in the region of a respective connection location (26), and wherein the optoelectronic semiconductor component is free of a growth substrate (2).

11 Claims, 3 Drawing Sheets

(56) References Cited

U.S. PATENT DOCUMENTS

2011/0254043 A1  10/2011  Negishi et al.
2014/0124802 A1   5/2014  Do et al.
2014/0145237 A1   5/2014  Do et al.

OPTOELECTRONICS SEMICONDUCTOR DEVICE AND METHOD FOR PRODUCING AN OPTOELECTRONIC SEMICONDUCTOR DEVICE

An optoelectronic semiconductor device and a method for producing an optoelectronic semiconductor device are provided.

This patent application is the U.S. National Phase under 35 U.S.C. § 371 of International Patent Application No. PCT/EP2016/050388, files on Jan. 11, 2016 which in turn claims priority from German patent application DE 102015101888.8 filed on Feb. 10, 2015, the disclosure content of which is hereby included by reference.

Optoelectronic semiconductor devices are known from the prior art which comprise a multiplicity of rod-shaped radiation-generating elements with diameters which may amount for example to less than 10 µm. These structures are so small that they cannot be arranged as desired using conventional methods. During growth thereof they may be placed at a desired location, for example by determining their arrangement by means of the growth mask used to produce them. This, however, results in other limitations, since for example an optimized growth process is only possible for radiation-generating elements of a specific, single color. On the other hand, they cannot be handled using a pick-and-place process, as in the case of planar light-emitting diodes. If such small structures are arranged on a foreign substrate, they are completely randomly oriented, without preferential direction, once they have been detached from their growth substrate.

Nanorod-based radiation-generating elements typically have a diameter of at most 5 µm and a length of between 1 and 100 µm.

The emission wavelength of the radiation-generating elements may be influenced to a degree by purposeful prepatterning of the substrate surface, i.e. by a suitable selection of the diameter and of the spacing of the mask openings for selective growth. The emission wavelength is also influenced in particular by the indium content in the semiconductor layer sequence, and the relationship of the facets involved in emission and the thickness of the semiconductor layer sequence also have a role to play. These parameters may be influenced to a certain extent by the diameter, aspect ratio (ratio of height to diameter) and spacing of the structures; they compete in this respect for the available growth material and thus influence one another in their immediate surroundings. However, this applies only to a limited degree.

The primary influencing parameters for indium content are the temperature and flow of the precursor materials. The colors emitted by the radiation-generating elements are thus predetermined by the growth process of the active layer, in particular the temperature. The lower is the temperature, the more red-shifted is the electromagnetic radiation emitted thereby. The consequence of this is that there is only a limited possibility of producing nanorods of different colors on a single wafer, since the latter has to be exposed to different temperatures to achieve this. All in all, it is therefore difficult to produce white light-emitting diodes, which comprise nanorods emitting blue light, green light and red light, epitaxially in such a way that overall they emit radiation with a desired white point. For precise adjustment of the white point, it would be advantageous to separate the epitaxial growth and the arrangement of the nanorods chronologically. The basic colors could then be produced individually using an epitaxial process respectively optimized for one color.

One object to be achieved consists in providing an optoelectronic semiconductor device which may be particularly efficiently operated. In particular, one object to be achieved consists in providing a white light-emitting optoelectronic device which comprises particularly small radiation-emitting elements and the white point of which may be adjusted as desired.

The objects are achieved by an optoelectronic semiconductor device and a method for producing an optoelectronic semiconductor device according to the independent claims.

An optoelectronic semiconductor device comprises a multiplicity of radiation-generating elements which are arranged spaced from one another on a surface of a carrier element, wherein each of the radiation-generating elements has a diameter, in a direction perpendicular to the surface of the carrier element, of less than 10 µm, preferably of less than 5 µm, in particular of less than 2 µm, and adheres to the surface of the carrier element in each case in the region of a connection point and wherein the optoelectronic semiconductor device is free of a growth substrate.

A growth substrate is here understood to mean a substrate on which the radiation-generating elements are grown epitaxially, in particular directly and without using an additional layer arranged between the growth substrate and the radiation-generating elements.

According to at least one embodiment, provision is made for the optoelectronic semiconductor device to be free of a mask layer (used in particular for growth of the radiation-generating elements). A mask layer is here understood to mean a layer with a multiplicity of cutouts, which is arranged on a growth substrate. The radiation-generating elements are formed on the growth substrate by epitaxial growth through the cutouts.

According to at least one embodiment, provision is made for the multiplicity of radiation-generating elements to be connected non-epitaxially to the carrier element, i.e. the radiation-generating elements are not grown epitaxially on the carrier element.

According to at least one embodiment, provision is made for each of the radiation-generating elements to be attached to the surface of the carrier element through interaction of a key element arranged on a root area of the radiation-generating element and a lock element arranged in the region of the connection point.

In this way, the radiation-generating elements may arrange themselves in a self-organized and self-adjusting manner at the respectively matching connection points of the carrier element, so enabling inexpensive and precise processing. In particular, such a procedure replaces a conventional pick-and-place method, which is not economically viable in the case of nano- and microstructures.

In the simplest case, the key element may take the form of a charged molecule or atom. This also allows separation of the radiation-generating elements by size and thus by wavelength, for example by electrophoresis.

According to at least one embodiment, provision is made for each of the radiation-generating elements to adhere to the surface of the carrier element through the action of a lock-and-key principle.

A lock-and-key principle is here understood to mean the interaction of two complementary structures which fit together spatially and preferably undergo a material bond. The structures may for example be biochemical structures, such as two mutually complementary DNA strands or mutually complementary antigen-antibody structures, which bond materially together through the action of the lock-and-key principle.

According to at least one embodiment, provision is made for each of the radiation-generating elements to be materially bonded to the surface of the carrier element in the region of the connection point.

According to at least one embodiment, provision is made for each of the radiation-generating elements to have a main direction of extension, a core region, which is formed with a first semiconductor material, an active layer, which covers the core region at least in directions transverse to the main direction of extension, and an outer layer, which is formed with a second semiconductor material and covers the active layer at least in directions transverse to the main direction of extension.

According to at least one embodiment, provision is made for the radiation-generating elements to be based on a nitride compound semiconductor material, for the first semiconductor material to be deposited epitaxially on the growth substrate, for a growth direction of the first semiconductor material to be substantially parallel to the main direction of extension, and for each of the radiation-generating elements to have a length in the main direction of extension and a diameter in a plane perpendicular to the main direction of extension, wherein the ratio of length to diameter is at least three, preferably at least five. The radiation-generating elements are preferably of rod-shaped configuration, but they may also be of other shapes, such as for example pyramids.

According to at least one embodiment, provision is made for each of the radiation-generating elements to have an electrode layer which covers the outer layer at least in directions transverse to the main direction of extension, wherein the electrode layer is transmissive to electromagnetic radiation generated in the active layer when in operation, the electrode layer is formed with a transparent conductive oxide and the electrode layer extends over at least a major part of the length of the radiation-generating element.

According to at least one embodiment, provision is made for each of the radiation-generating elements to comprise a passivation layer, which directly adjoins the surface of the carrier element and the core region.

According to at least one embodiment, provision is made for the optoelectronic semiconductor device to comprise a first multiplicity of radiation-generating elements of a first type and a second multiplicity of radiation-generating elements of a second type, wherein the radiation-generating elements of the first type are configured to generate electromagnetic radiation of a first wavelength range, and wherein the radiation-generating elements of the second type are configured to generate electromagnetic radiation of a second wavelength range different from the first wavelength range.

The optoelectronic semiconductor device preferably additionally comprises a third multiplicity of radiation-generating elements of a third type, wherein the radiation-generating elements of the third type are configured to generate electromagnetic radiation of a third wavelength range different from the first and second wavelength ranges.

Preferably, the radiation-generating elements of the first type are configured to generate red light, the radiation-generating elements of the second type are configured to generate green light, and the radiation-generating elements of the third type are configured to generate blue light. As a result of the above-described solutions, in particular use of the lock-and-key principle, there is in this case no need to select growth conditions which are simultaneously optimal for all three colors, such that a higher yield and better electrical and optical characteristics may be achieved. Since a certain size and thus wavelength distribution of the radiation-generating elements also occurs, it is advantageous to sort these by size and thus by wavelength. In this way, it subsequently possible to achieve either a narrow wavelength distribution for projection and display applications or a purposeful mixture of sizes for a white light-emitting diode with the broadest possible spectrum for a high color rendering index. Through individual energization of radiation-generating elements of different types, production of an active microdimensional display is also possible. In this respect, the carrier element may consist of a structure which is as far as possible planar, since there is no need for an increase in the size of the surface.

According to at least one embodiment, provision is made for the carrier element to comprise separately controllable conductor tracks, which are each associated with one type of radiation-generating element. The conductor tracks are in particular associated unambiguously, for example on a one-to-one basis, with the respective radiation-generating elements.

The conductor tracks may for example be copper conductor tracks on a multilayer board. The conductor tracks serve in electrical contacting of the radiation-generating elements when the latter are in radiation-generating operation. In particular, the conductor tracks are configured for individual energization of the radiation-generating elements of different types. In other words, the conductor tracks may serve in individual control of ensembles of the various radiation-generating elements.

According to at least one embodiment, provision is made for the surface of the carrier element to be of non-planar configuration to enlarge the area thereof and for said surface to comprise elements projecting out of the main plane of extension of the carrier element, for example in the form of pyramids or hemispheres.

A method for producing an optoelectronic semiconductor device comprises the following method steps:

forming a multiplicity of radiation-generating elements through epitaxial growth on a growth substrate, wherein the radiation-generating elements have a diameter in a direction perpendicular to the main plane of extension of the growth substrate of less than 10 μm, preferably of less than 5 μm, for example of less than 2 μm, removing the growth substrate, such that root areas of the radiation-generating elements are exposed, arranging the multiplicity of radiation-generating elements on a surface of a carrier element, such that the root area of each of the radiation-generating elements adheres to the surface of the carrier element in each case in the region of a connection point.

According to at least one embodiment of the method, provision is made for the radiation-generating elements to be introduced into a solution after removal of the growth substrate and for the surface of the carrier element subsequently to be dipped into the solution.

Epitaxial growth of the radiation-generating elements may for example take place on a growth substrate of silicon, which is preferably prepatterned and on which a mask layer of silicon dioxide is for example arranged. Then the growth substrate and the mask layer are removed by an etching step and the radiation-generating elements detached from the growth substrate are introduced into the etching solution. Alternatively, the radiation-generating elements may be detached from the growth substrate by mechanical methods. In this case, the growth substrate can be reused.

According to at least one embodiment of the method, provision is made for the radiation-generating elements to arrange themselves on the surface of the carrier element in a self-organized manner.

This may proceed in that materials are added to the solution, into which the radiation-generating elements have been introduced, which form key elements on the root areas of the radiation-generating elements, i.e. on the face which was previously in contact with the growth substrate, which key elements connect in the region of the connection point with a matching complementary lock element on the surface of the carrier element. If radiation-generating elements of different types are used, a multiplicity of materials may be added to the solution which in each case form different key elements on the root areas of the different radiation-generating elements.

For example, the key element bond may be sensitive to the crystal polarity of the root area. Arrangement of the key elements on the root areas of the radiation-generating elements may be simplified by light- or heat-induced reactions. Because of waveguide characteristics of the typically rod-shaped radiation-generating elements, a higher light and/or heat intensity arises at the root areas than at the side faces under irradiation by a light source. In this way, mounting of the key elements to the root areas and/or subsequent connection with the lock elements may be simplified. In the case of a light-induced reaction, said reaction may be purposefully assisted for radiation-generating elements of a specific type (i.e. a specific color) by the use of resonance effects (for example in the case of irradiation of light with an energy just above the band edge of the structure in question).

According to at least one embodiment of the method, provision is made for each of the radiation-generating elements to be arranged through the action of an electrical field in each case at a connection point on the surface of the carrier element. In this case, for example, a root area of each of the radiation-generating elements may be oppositely charged to the connection point at the surface of the carrier element. In this way, the two relevant regions are oriented facing one another so as to fit together and may undergo mechanical connection.

For example, the root area of a radiation-generating element may comprise metallization, at which the radiation-generating element has a positive or negative electrical charge. Alternatively or in addition, during growth of the radiation-generating elements charges may be generated through purposeful modification of the band structure of the semiconductor material. For example, deep impurities may be provided, in particular by purposeful doping with suitable impurity atoms, which cause electrical charging in the region of the root area of the radiation-generating element. Alternatively, electrical charging may be achieved in the region of the root area of the radiation-generating element through excitation with light of a suitable wavelength. As a result of absorption, electron-hole pairs are here generated in the semiconductor material, while charge separation proceeds as a result of the diffusion potential of the pn junction. If this approach is adopted, it is also possible to dispense with the use of a lock-and-key principle for mounting the radiation-generating elements on the carrier.

According to at least one embodiment of the method, provision is made for the multiplicity of radiation-generating elements to be enveloped by a matrix material and for the growth substrate subsequently to be removed, such that the root areas of the radiation-generating elements are arranged spaced from one another at an edge face of the matrix material and are externally accessible for further processing.

The matrix material may for example be a material which forms a passivating layer which conformally encapsulates the for example rod-shaped radiation-generating elements while still on the growth substrate and optionally grows together into a continuous layer on application of a sufficient thickness. Alternatively, a matrix material may be used which encases the structures and is applied, for example, by spin coating. The matrix material may for example be a photoresist, a parylene or a further flexible material such as a polymer. Together with the matrix material, the radiation-generating elements may be detached from, for example peeled off, the growth substrate, so exposing the root areas for further processing. In this latter embodiment it is possible to dispense with processing in a solution.

The matrix material may likewise be a transparent conductive oxide which forms an electrode layer in the finished optoelectronic semiconductor device.

According to at least one embodiment of the method, electrical contact points are provided on the surface of the carrier element, in the region of the connection points, which contact points comprise an electrically conductive contact material. The matching lock elements which connect with the key elements of the radiation-generating elements are preferably arranged on the electrical contact points or in the regions thereof. The electrical contact points may be formed by metallic layers or three-dimensional metallic structures, but also by carbon nanotubes or other conductive materials.

While the method is being performed, predetermined potentials may be applied to the electrical contact points in order correctly to orient electrically charged root areas of the radiation-generating elements and to move the radiation-generating elements in the solution towards the electrical contact points. If radiation-generating elements of different types are used, through purposeful control of the potentials of the electrical contact points it may be ensured that radiation-generating elements of a specific type preferably remain adhered to the desired connection points.

According to at least one embodiment of the method, a materially bonded joint between the radiation-generating elements and the carrier element may be achieved by exposure to an elevated temperature. For example, the interlocking lock and key elements may be ashed by a heat-treatment step and the radiation-generating elements soldered into the contact metal of the electrical contact points.

According to at least one embodiment, the optoelectronic semiconductor device comprises a control unit which controls the power supply to the radiation-generating elements of the various types and in this way establishes the white point or indeed a color point which does not lie on the Planck curve. A sensor element may optionally be integrated which detects the color characteristics of the light emitted by the optoelectronic semiconductor device and may be used as an input signal for controlling the color location.

BRIEF DESCRIPTION OF THE FIGURES

The optoelectronic semiconductor device described here and a method for the production thereof are explained in greater detail below with reference to exemplary embodiments and the associated figures.

Figure 1A:
FIGS. 1A to 1I make reference to method steps for producing an exemplary embodiment of an optoelectronic semiconductor device as described here that are explained in greater detail on the basis of schematic sectional representations.

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

With reference to FIGS. 1A to 1I, method steps for producing an optoelectronic semiconductor device as described here are explained in greater detail on the basis of schematic sectional representations.

According to FIG. 1A, first of all a mask layer 4 consisting of silicon dioxide and having openings 6 is applied to a growth substrate 2 of silicon.

Figure 1B:
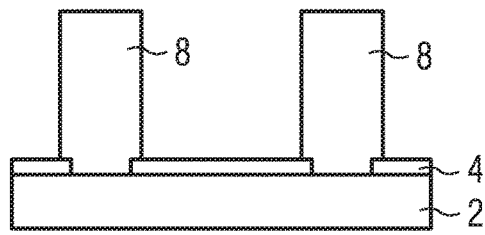
Figure 1C:
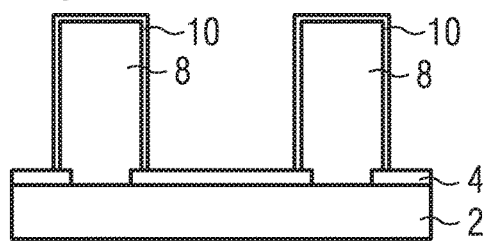

As shown in FIG. 1B, the core regions 8, which are formed with a first semiconductor material, are then deposited epitaxially onto the mask layer 4 and grown onto the material of the growth substrate 2 only in the region of the openings 6. Cylindrical or prism-shaped core regions 8 result, for example.

An active layer 10 is deposited epitaxially onto the outer face of each of the core regions 8.

Figure 1D:
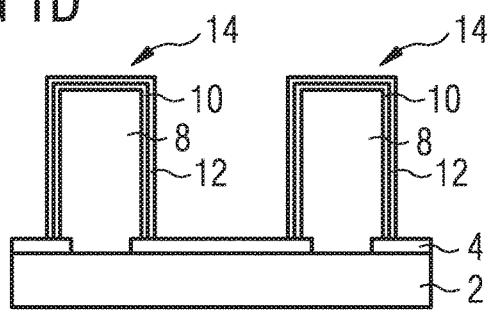

In the next method step shown in FIG. 1D, an outer layer 12 is deposited epitaxially onto the active layer 10. The outer layer 12 completely covers the active layer 10. In this way, a multiplicity of radiation-generating elements 14 is formed on the growth substrate, wherein the radiation-generating elements have a diameter of less than 5 µm in a direction perpendicular to the main plane of extension of the growth substrate.

Figure 1E:
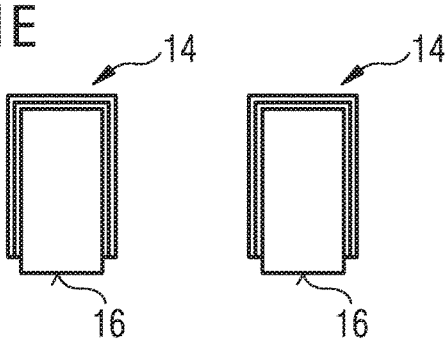

In the next method step shown in FIG. 1E, the growth substrate 2 and the mask layer 4 are removed in an etching step, wherein the now singulated radiation-generating elements 14 are introduced into the etching solution and move freely therein. The root areas 16 of the radiation-generating elements 14, which were previously in contact with the growth substrate 2, are now free for further processing.

Figure 1F:
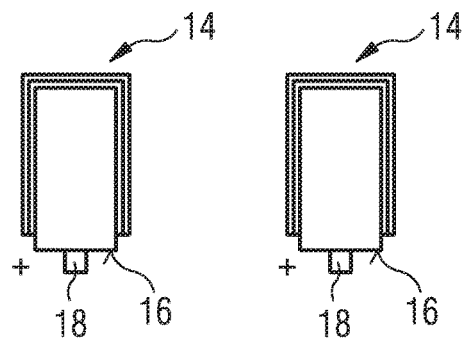

In the next method step shown in FIG. 1F, key elements 18 are arranged on the root areas 16 of the radiation-generating elements 14 still located in the etching solution or in a further solution different from the etching solution. This proceeds through the addition of suitable materials to the solution. The root areas 16 are positively charged in the region of the key elements 18. For example, each of the key elements 18 may in itself be positively charged.

Figure 1G:
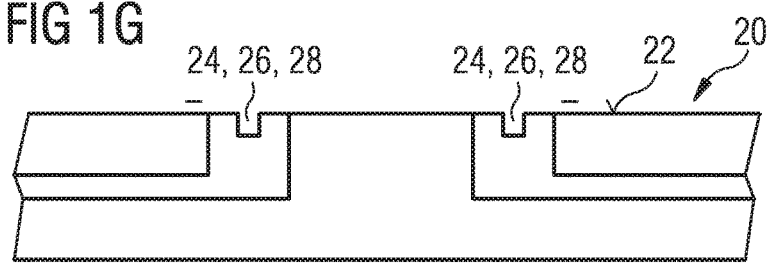
Figure 1H:
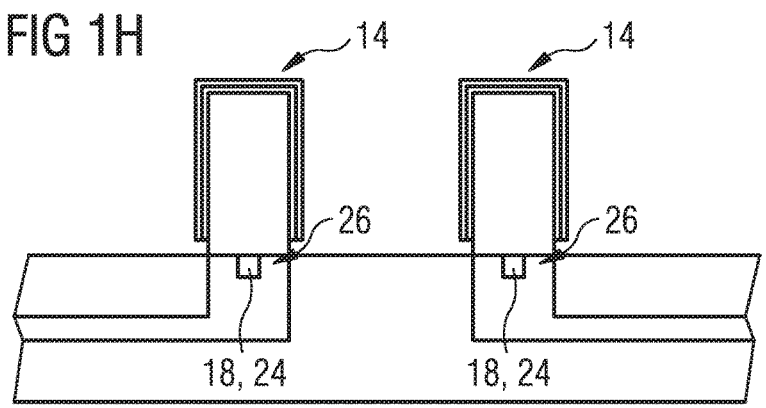

In the next method step shown in FIG. 1G, a carrier element 20 is provided, on the surface 22 of which a multiplicity of lock elements 24 are arranged. Each lock element 24 is located respectively in the region of one connection point 26. In the region of the connection points 26 electrical contact points 28 are provided which comprise an electrically conductive contact material and which may be set at a specified electrical potential. To attract the positively charged root areas 16 of the radiation-generating elements 14, the contact points 28 are set at a negative potential. When the surface 22 of the carrier element 20 is dipped into the etching solution, the radiation-generating elements 14 are moved towards the surface 22 and, through the action of the electrical field, in each case arranged at a connection point on the surface 22 of the carrier element 20, where they adhere through the action of a lock-and-key principle (FIG. 1H).

Figure 1I:
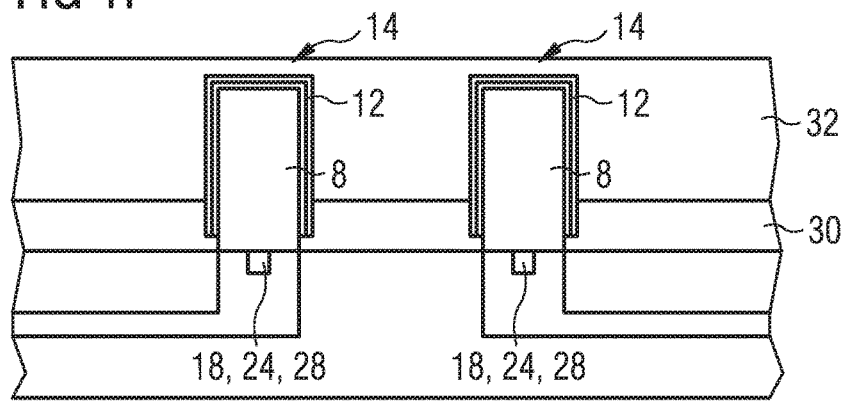

In the next method step shown in FIG. 1I, the interlocking lock and key elements 18, 24, are ashed by a heat-treatment step and the radiation-generating elements 14 soldered into the contact metal of the electrical contact points 28.

Moreover, a passivation layer 30 and an electrode layer 32 are formed. The passivation layer 30 here directly adjoins the surface 22 of the carrier element 20 and the core regions 8 of the radiation-generating elements 14, while the electrode layer 32 is arranged on the passivation layer 30 and moreover covers the outer layer 12.

Figure 2A:
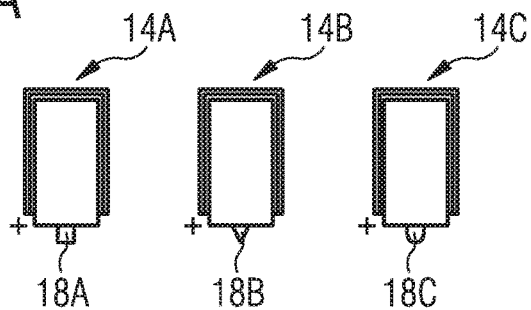
FIGS. 2A to 2C make reference to method steps for producing a further exemplary embodiment of an optoelectronic semiconductor device as described here that are explained in greater detail on the basis of schematic sectional representations.
Figure 2B:
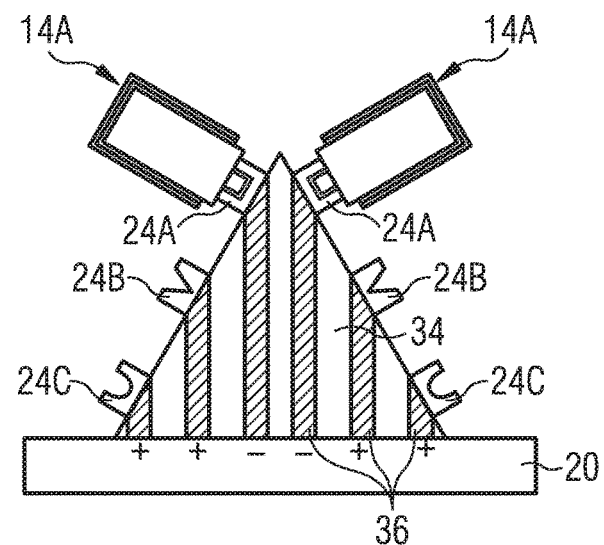
Figure 2C:
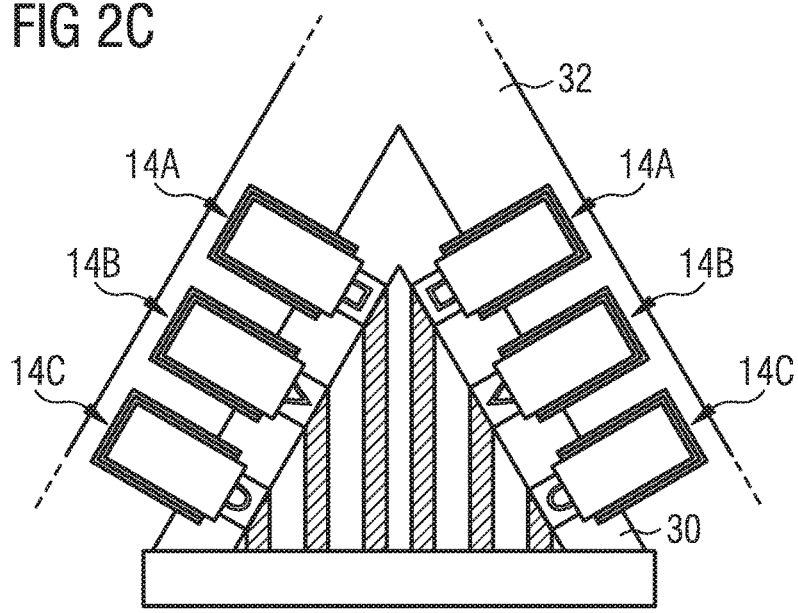

With reference to FIGS. 2A to 2C, method steps for producing an optoelectronic semiconductor device according to a further exemplary embodiment are explained on the basis of schematic sectional representations.

Unlike in the previous exemplary embodiment, radiation-generating elements of a first, second and third type are provided. The radiation-generating elements of the first type 14A are configured to generate red light, the radiation-generating elements of the second type 14B are configured to generate green light and the radiation-generating elements of the third type 14C are configured to generate blue light. They each have differently configured key elements 18A, 18B and 18C (see FIG. 2A).

The surface of the carrier element 20 may be of non-planar configuration to enlarge the area thereof and may comprise structures projecting from the main plane of extension of the carrier element 20, which structures may for example take the form of pyramids 34, of which just one is illustrated in FIG. 2B.

On the surface of the pyramids 34 lock elements of a first type 24A, a second type 24B and a third type 24C are arranged, which are respectively of complementary configuration to the key elements 18A, 18B and 18C.

By controlling conductor tracks 36 suitably, the lock elements 24A, 24B, 24C may each be set at a suitable potential. In other words, the carrier element 20 comprises separately controllable conductor tracks 36, which are each associated with one type 14A, 14B, 14C of the radiation-generating elements 14. The conductor tracks 36 may for example be copper conductor tracks on a multilayer board. The board is in particular a metal-core board, in order to be able to ensure heat dissipation from the board. Embodiment in the form of a ceramic is also conceivable. The conductor tracks 36 may in particular further serve to individually control ensembles of the various radiation-generating elements 14A, 14B, 14C.

In the method step shown in FIG. 2B, the lock elements 24A are set at a negative potential and the lock elements 24B, 24C at a positive potential. When the carrier element 20 is dipped into a solution which comprises only the radiation-generating elements of the first type 14A, the latter adhere, in a manner similar to the mechanism described with reference to FIGS. 1F to 1I, to the surface of the pyramids 34 through the action of the lock-and-key principle between the key element 18A and the lock element 24A of complementary configuration.

In the method step shown in FIG. 2C, the same step is repeated for the other two pairs of complementary structures 18B, 24B and 18C, 24C respectively, such that the resultant optoelectronic device comprises radiation-generating elements 14A, 14B and 14C of three different colors which are mutually independently controllable, whereby white light with a desired color point may be generated. As in the previous exemplary embodiment, a passivation layer 30 and an electrode layer 32 are additionally formed.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. Optoelectronic semiconductor device having a multiplicity of radiation-generating elements which are arranged spaced from one another on a surface of a carrier element, wherein each of the radiation-generating elements adheres to the surface of the carrier element in each case in a region of a connection point and wherein the optoelectronic semiconductor device is free of a growth substrate, wherein the optoelectronic semiconductor device comprises a first multiplicity of radiation-generating elements of a first type and a second multiplicity of radiation-generating elements of a second type, wherein the radiation-generating elements of the first type are configured to generate electromagnetic radiation of a first wavelength range, and wherein the radiation-generating elements of the second type are configured to generate electromagnetic radiation of a second wavelength range different from the first wavelength range, and the carrier element comprises separately controllable conductor tracks, wherein each of the conductor tracks is associated with only one type of radiation-generating element.

2. Semiconductor device according to claim 1, wherein each of the radiation-generating elements is attached to the surface of the carrier element through interaction of a key element arranged on a root area of the radiation-generating element and a lock element arranged in the region of the connection point.

3. Semiconductor device according to claim 1, wherein each of the radiation-generating elements adheres to the surface of the carrier element through an action of a lock-and-key principle.

4. Semiconductor device according to claim 1, wherein each of the radiation-generating elements is materially bonded to the surface of the carrier element in the region of the connection point.

5. Semiconductor device according to claim 1, wherein each of the radiation-generating elements has a main direction of extension, a core region, which is formed with a first semiconductor material, an active layer, which covers the core region at least in directions transverse to the main direction of extension, and an outer layer, which is formed with a second semiconductor material and covers the active layer at least in directions transverse to the main direction of extension.

6. Semiconductor device according to claim 1, wherein the radiation-generating elements are based on a nitride compound semiconductor material, the first semiconductor material is deposited epitaxially on the growth substrate, a growth direction of the first semiconductor material is substantially parallel a main direction of extension of the radiation-generating elements, and each of the radiation-generating elements has a length in the main direction of extension and a diameter in a plane perpendicular to the main direction of extension, wherein a ratio of length to diameter is at least three.

7. Semiconductor device according to claim 1, wherein the surface of the carrier element is of non-planar configuration to enlarge an area thereof and comprises elements projecting out of a main plane of extension of the carrier element.

8. Semiconductor device according to claim 1, wherein each of the radiation-generating elements is rod-shaped in a direction perpendicular to the surface of the carrier element and has a diameter of less than 10 µm.

9. Optoelectronic semiconductor device having a multiplicity of radiation-generating elements which are arranged spaced from one another on a surface of a carrier element, wherein each of the radiation-generating elements adheres to the surface of the carrier element in each case in a region of a connection point and wherein the optoelectronic semiconductor device is free of a growth substrate, wherein the optoelectronic semiconductor device comprises a first multiplicity of radiation-generating elements of a first type and a second multiplicity of radiation-generating elements of a second type, wherein the radiation-generating elements of the first type are configured to generate electromagnetic radiation of a first wavelength range, and wherein the radiation-generating elements of the second type are configured to generate electromagnetic radiation of a second wavelength range different from the first wavelength range, and the carrier element comprises separately controllable conductor tracks, wherein the conductor tracks are each associated with one type of radiation-generating element, wherein each of the radiation-generating elements is attached to the surface of the carrier element through interaction of a key element arranged on a root area of the radiation-generating element and a lock element arranged in the region of the connection point, and each of the radiation-generating elements of the first type comprises a key element of a first type and each of the radiation-generating elements of the second type comprises a key element of a second type, wherein the key elements of the first type are differently configured from the key elements of the second type, and wherein lock elements of a first type and a second type are respectively of complementary configuration to the key elements.

10. Semiconductor device according to claim 9, wherein each of the radiation-generating elements is rod-shaped in a direction perpendicular to the surface of the carrier element and has a diameter of less than 10 µm.

11. Semiconductor device according to claim 9, wherein the surface of the carrier element is of non-planar configuration to enlarge an area thereof and comprises elements projecting out of a main plane of extension of the carrier element.

* * * * *

UNITED STATES PATENT AND TRADEMARK OFFICE
CERTIFICATE OF CORRECTION

PATENT NO. : 10,497,830 B2  
APPLICATION NO. : 15/550008  
DATED : December 3, 2019  
INVENTOR(S) : Thomas Lehnhardt et al.

Page 1 of 1

It is certified that error appears in the above-identified patent and that said Letters Patent is hereby corrected as shown below:

On the Title Page

Column 1, (54) Title should read:
OPTOELECTRONIC SEMICONDUCTOR DEVICE AND METHOD FOR PRODUCING AN OPTOELECTRONIC SEMICONDUCTOR DEVICE Signed and Sealed this
Third Day of March, 2020

Andrei Iancu
*Director of the United States Patent and Trademark Office*